United States Patent
Chang et al.

(10) Patent No.: US 10,483,398 B2
(45) Date of Patent: *Nov. 19, 2019

(54) SEMICONDUCTOR DEVICE WITH GATE STACK

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/042,164

(22) Filed: Jul. 23, 2018

(65) Prior Publication Data

US 2018/0358466 A1  Dec. 13, 2018

Related U.S. Application Data

(60) Continuation of application No. 15/467,643, filed on Mar. 23, 2017, now Pat. No. 10,032,916, which is a
(Continued)

(51) Int. Cl.
*H01L 29/78* (2006.01)
*H01L 29/423* (2006.01)
(Continued)

(52) U.S. Cl.
CPC .... *H01L 29/7851* (2013.01); *H01L 21/28247* (2013.01); *H01L 29/41775* (2013.01);
(Continued)

(58) Field of Classification Search
CPC .......... H01L 29/7851; H01L 29/41791; H01L 21/28247; H01L 29/41775;
(Continued)

(56) References Cited

U.S. PATENT DOCUMENTS 8,048,790 B2   11/2011   Soss et al.
8,772,168 B2   7/2014    Xie et al.
(Continued)

FOREIGN PATENT DOCUMENTS

KR   10-2007-0111795 A   11/2007
TW        200403849 A    3/2004
(Continued)

*Primary Examiner* — Anthony Ho
(74) *Attorney, Agent, or Firm* — Birch, Stewart, Kolasch & Birch, LLP

(57) ABSTRACT

A semiconductor device is provided. The semiconductor device includes a gate stack over a semiconductor substrate. The semiconductor device also includes a protection element over the gate stack, and a top and a bottom of the protection element have different widths. The semiconductor device further includes a spacer over a side surface of the protection element and a sidewall of the gate stack. In addition, the semiconductor device includes a conductive contact electrically connected to a conductive feature over the semiconductor substrate.

20 Claims, 14 Drawing Sheets

Related U.S. Application Data division of application No. 14/827,092, filed on Aug. 14, 2015, now Pat. No. 9,614,089, which is a continuation-in-part of application No. 14/743,768, filed on Jun. 18, 2015, now Pat. No. 9,450,099.

(60) Provisional application No. 62/175,816, filed on Jun. 15, 2015.

(51) Int. Cl.
    *H01L 29/66*     (2006.01)
    *H01L 29/417*     (2006.01)
    *H01L 21/28*     (2006.01)

(52) U.S. Cl.
CPC .. *H01L 29/41783* (2013.01); *H01L 29/41791* (2013.01); *H01L 29/4232* (2013.01); *H01L 29/6653* (2013.01); *H01L 29/6656* (2013.01); *H01L 29/66545* (2013.01); *H01L 29/66795* (2013.01)

(58) Field of Classification Search
CPC ........... H01L 29/41783; H01L 29/4232; H01L 29/66795; H01L 29/6656; H01L 29/66545; H01L 29/6653
See application file for complete search history.

(56) References Cited

U.S. PATENT DOCUMENTS

| | | | |
|---|---|---|---|
| 9,450,099 B1 * | 9/2016 | Chang | H01L 29/7851 |
| 9,614,089 B2 * | 4/2017 | Chang | H01L 29/4232 |
| 2002/0173105 A1 | 11/2002 | Park et al. | |
| 2004/0026734 A1 | 2/2004 | Clevenger et al. | |
| 2004/0135212 A1 | 7/2004 | Dokumaci et al. | |
| 2006/0006478 A1 | 1/2006 | Kanegae et al. | |
| 2010/0052075 A1 | 3/2010 | Yeh et al. | |
| 2011/0073957 A1 | 3/2011 | Chiu et al. | |
| 2011/0193162 A1 | 8/2011 | Chuang et al. | |
| 2013/0189834 A1 | 7/2013 | Ramachandran et al. | |
| 2014/0070320 A1 | 3/2014 | Mukherjee et al. | |
| 2014/0203333 A1 | 7/2014 | Huang et al. | |
| 2014/0217482 A1 | 8/2014 | Xie et al. | |
| 2014/0367790 A1 | 12/2014 | Choi et al. | |
| 2014/0374805 A1 | 12/2014 | Wu et al. | |
| 2015/0035073 A1 | 2/2015 | Ando et al. | |
| 2015/0069535 A1 | 3/2015 | Chang et al. | |
| 2015/0118836 A1 | 4/2015 | Lin et al. | |
| 2015/0255542 A1 | 9/2015 | Cai et al. | |

FOREIGN PATENT DOCUMENTS

| | | |
|---|---|---|
| TW | 586151 B | 5/2004 |
| TW | 201133649 A1 | 10/2011 |
| TW | 201314840 A1 | 4/2013 |

\* cited by examiner

SEMICONDUCTOR DEVICE WITH GATE STACK

PRIORITY CLAIM AND CROSS-REFERENCE

This application is a Continuation application of U.S. patent application Ser. No. 15/467,643, filed on Mar. 23, 2017, which is a Divisional of U.S. application Ser. No. 14/827,092, filed on Aug. 14, 2015, which is a Continuation-In-Part of U.S. patent application Ser. No. 14/743,768, filed Jun. 18, 2015 (now U.S. Pat. No. 9,450,099) and claims the benefit of U.S. Provisional Application No. 62/175,816, filed on Jun. 15, 2015, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
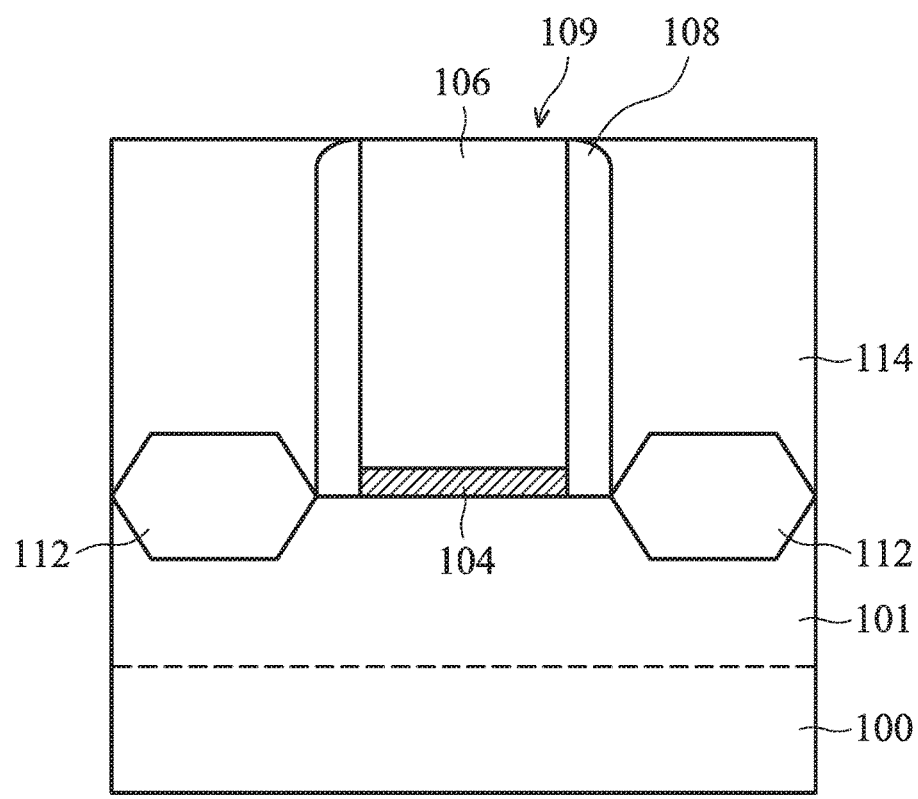
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1I are cross-sectional views of various stages of a process for forming a semiconductor device structure, in accordance with some embodiments. Additional operations can be provided before, during, and/or after the stages described in FIGS. 1A-1I. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, one or multiple fin structures are formed. As shown in FIG. 1A, one of the fin structures (the fin structure 101) is shown. In some embodiments, multiple recesses (or trenches) (not shown) are formed in the semiconductor substrate 100. As a result, multiple fin structures including a fin structure 101 are formed between the recesses. In some embodiments, one or more photolithography and etching processes are used to form the recesses.

As shown in FIG. 1A, isolation features (not shown) are formed in the recesses to surround a lower portion of the fin structure 101, in accordance with some embodiments. The isolation features are used to define and electrically isolate various device elements formed in and/or over the semiconductor substrate 100. In some embodiments, the isolation features include shallow trench isolation (STI) features, local oxidation of silicon (LOCOS) features, another suitable isolation feature, or a combination thereof.

In some embodiments, each of the isolation features has a multi-layer structure. In some embodiments, the isolation features are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features. Similarly, the STI liner may also be used to reduce crystalline defects at the interface between the fin structures and the isolation features.

In some embodiments, a dielectric material layer is deposited over the semiconductor substrate 100. The dielectric material layer covers the fin structures including the fin structure 101 and fills the recesses between the fin structures. In some embodiments, the dielectric material layer is deposited using a chemical vapor deposition (CVD) process, a spin-on process, another applicable process, or a combination thereof. In some embodiments, a planarization process is performed to thin down the dielectric material layer until the fin structure 101 is exposed. The planarization process may include a chemical mechanical polishing (CMP) process, a grinding process, an etching process, another applicable process, or a combination thereof. Afterwards, the dielectric material layer is etched back to below the top of the fin structure 101. As a result, the isolation features are formed. The fin structures including the fin structure 101 protrude from the isolation features, in accordance with some embodiments.

As shown in FIG. 1A, a gate dielectric layer 104 is deposited over the isolation features and the fin structure 101, in accordance with some embodiments. In some embodiments, the gate dielectric layer 104 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 104 is a dummy gate dielectric layer which will subsequently be removed. In some other embodiments, the gate dielectric layer 104 is not formed.

In some embodiments, the gate dielectric layer 104 is deposited using a chemical vapor deposition (CVD) process, an atomic layer deposition (ALD) process, a thermal oxidation process, a physical vapor deposition (PVD) process, another applicable process, or a combination thereof.

Afterwards, a gate electrode 106 is formed over the gate dielectric layer 104 to cover a portion of the fin structure 101, as shown in FIG. 1A in accordance with some embodiments. In some embodiments, the gate electrode 106 is a dummy gate electrode which will be replaced with a metal gate electrode. In some embodiments, the gate electrode 106 is made of polysilicon. In some embodiments, the portion of the fin structure 101 under the gate electrode 101 serves as a channel region.

In some embodiments, a gate electrode layer is deposited over the gate dielectric layer 104 using a CVD process or another applicable process. In some embodiments, the gate electrode layer is made of polysilicon. Afterwards, a patterned hard mask layer (not shown) is formed over the gate electrode layer, in accordance with some embodiments. The patterned hard mask layer may be used to pattern the gate electrode layer into one or more gate electrodes including the gate electrode 106 shown in FIG. 1A. In some embodiments, the gate dielectric layer 104 is also patterned, as shown in FIG. 1A. The gate electrode 106 and the gate dielectric layer 104 may together form a gate stack 109. In some embodiments, the gate stack 109 is a dummy gate stack and will be replaced with a metal gate stack. In some embodiments, the gate stack 109 surrounds side surfaces and a top surface of the fin structure 101 and further extends over the semiconductor substrate 100.

In some embodiments, the patterned hard mask layer includes a first hard mask layer and a second hard mask layer. The first hard mask layer is between the gate electrode layer and the second hard mask layer. In some embodiments, the first hard mask layer is made of silicon nitride. In some embodiments, the second hard mask layer is made of silicon oxide. In some embodiments, the second hard mask layer is thicker than the first mask layer.

In some embodiments, sealing elements (not shown) are formed over sidewalls of the gate stack 109. The sealing elements may be used to protect the gate stack 109 and assist in a subsequent process for forming lightly-doped source/drain (LDS/D) regions. In some embodiments, an ion implantation process is used to form the LDS/D regions. In some other embodiments, the sealing elements are not formed. In some other embodiments, the LDS/D regions are not formed.

Afterwards, spacer elements 108 are formed over sidewalls of the gate stack 109, as shown in FIG. 1A in accordance with some embodiments. The spacer elements 108 may be used to protect the gate stack 109 and assist in a subsequent process for forming source/drain features. In some embodiments, the spacer elements 108 are made of a dielectric material. The dielectric material may include silicon nitride, silicon oxynitride, silicon oxide, another suitable material, or a combination thereof.

In some embodiments, a dielectric material layer is deposited over the semiconductor substrate 100 and the gate stack 109. The dielectric material layer may be deposited using a CVD process, an ALD process, a spin-on process, another applicable process, or a combination thereof. Afterwards, the dielectric material layer is partially removed using an etching process, such as an anisotropic etching process. As a result, the remaining portions of the dielectric material layer over the sidewalls of the gate stack 109 form the spacer elements 108.

As shown in FIG. 1A, source/drain features 112 are formed over the portions of the fin structure 101, in accordance with some embodiments. In some embodiments, the fin structure 101 is partially removed to form recesses near the spacer elements 108. Afterwards, an epitaxial growth process is performed to form the source/drain features 112, as shown in FIG. 1A in accordance with some embodiments. In some embodiments, the source/drain features 112 are also used as stressors that can apply strain or stress on the channel region between the source/drain features 112. The carrier mobility may be improved accordingly.

As shown in FIG. 1A, a dielectric layer 114 is formed to surround the gate stack 109, in accordance with some embodiments. In some embodiments, a dielectric material layer is deposited to cover the source/drain features 112, the spacer elements 108, and the gate stack 109. Afterwards, a planarization process is used to partially remove the dielectric material layer until the gate electrode 106 is exposed. As a result, the dielectric layer 114 is formed.

In some embodiments, the dielectric material layer is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a CVD process, an ALD process, a spin-on process, another applicable process, or a combination thereof. In some embodiments, the planarization process includes a CMP process, a grinding process, an etching process, another applicable process, or a combination thereof.

In some embodiments, multiple etching operations are performed to remove the gate electrode 106. In some embodiments, these etching operations are performed within the same process chamber.

Figure 1B:
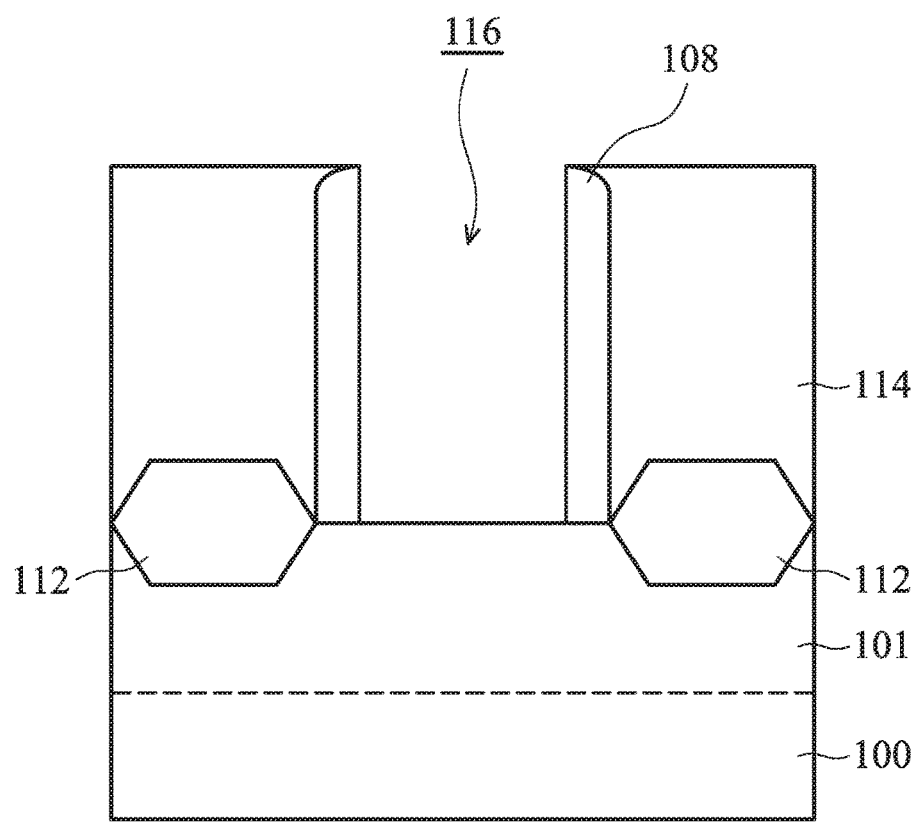

As shown in FIG. 1B, the gate electrode 106 is removed to form a recess 116 between the spacer elements 108, in accordance with some embodiments. Afterwards, the gate dielectric layer 104 is removed, in accordance with some embodiments. The recess 116 exposes the fin structure 101 in some embodiments. One or more etching processes may be used to form the recess 116.

Figure 1C:
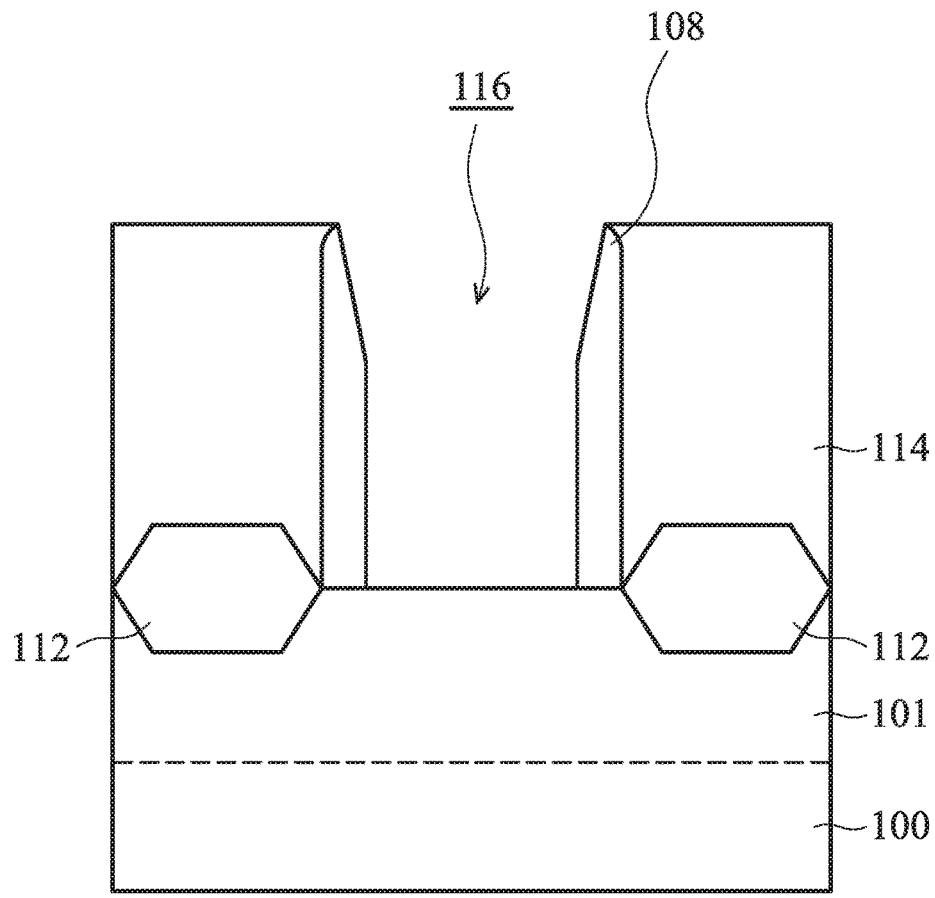

As shown in FIG. 1C, the spacer elements 108 are partially removed to enlarge the width of the recess 116, in accordance with some embodiments. In some embodiments, an upper portion of the recess 116 gradually becomes narrower along a direction from a top of the recess 116 towards the semiconductor substrate 100. In some embodiments, an etching process, such as an anisotropic etching process, is used to partially remove the spacer elements 108. The conditions of the etching process are fine-tuned to laterally etch upper portions of the spacer elements 108. In some embodiments, a gas mixture is used as the reaction gas for performing the etching process. The gas mixture may include $CF_4$, $O_2$, $CHF_3$, $N_2$, Ar, $NF_3$, He, HBr, $Cl_2$, $SF_6$, $CH_4$, another suitable gas, or a combination thereof. During the etching operations, the composition of the gas mixture may be varied according to requirements.

In some embodiments, the pressure during the etching operations is maintained in a range from about 1 mtorr to about 80 mtorrs. In some embodiments, the operation power used for performing the etching operations is in a range from about 100 W to about 1500 W. In some embodiments, the operation temperature for performing the etching operations is in a range from about 10 degrees C. to about 80 degrees C. In some embodiments, the operation time for performing the etching operations is in a range from about 5 seconds to about 600 seconds.

Figure 1D:
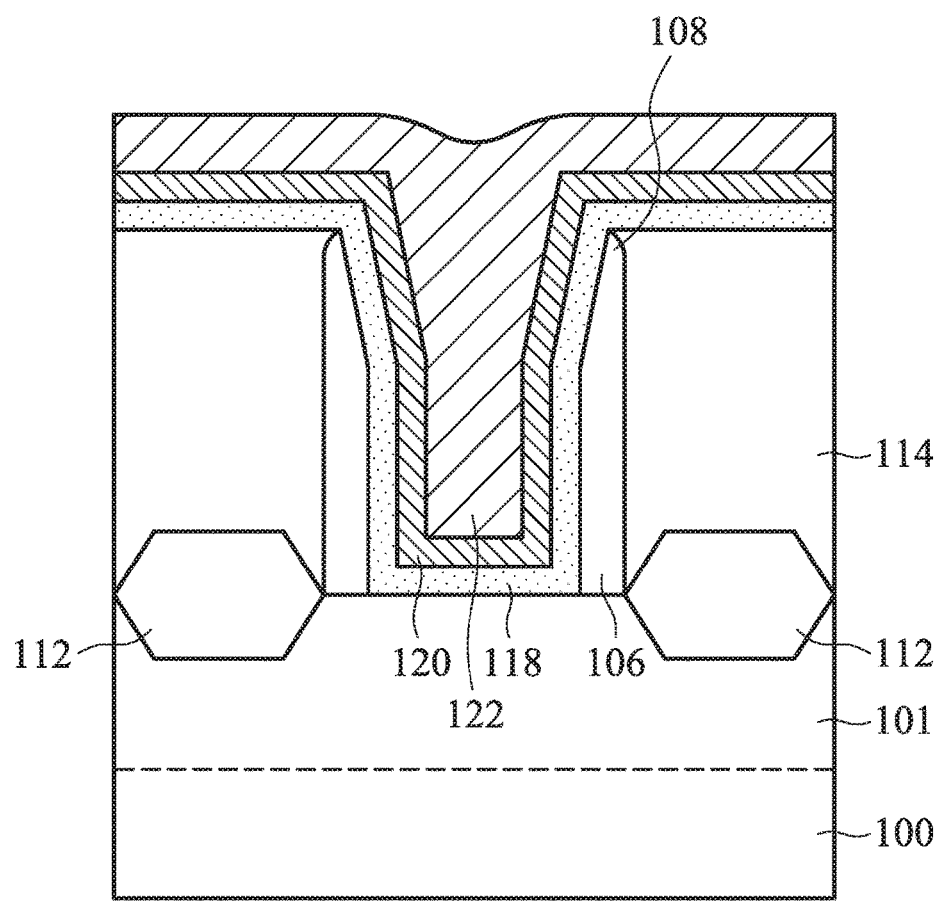

As shown in FIG. 1D, metal gate stack layers including a gate dielectric layer 118, a work function layer 120, and a conductive filling layer 122 are deposited to fill the recess 116, in accordance with some embodiments. The metal gate stack layers may include one or more other layers. For example, a barrier layer is formed between the gate dielectric layer 118 and the work function layer 120. A blocking layer may be formed between the work function layer 120 and the conductive filling layer 122. In some embodiments, the filling of the metal gate stack layers becomes easier since the recess 116 is widened after the etching process mentioned above.

In some embodiments, the gate dielectric layer 118 is made of a dielectric material with high dielectric constant (high-K). The gate dielectric layer 118 may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The work function layer 120 is used to provide the desired work function for transistors to enhance device performance, such as improved threshold voltage. In some embodiments, the work function layer 120 is an n-type metal layer capable of providing a work function value that is suitable for the device, such as equal to or less than about 4.5 eV. In some embodiments, the work function layer 120 is a p-type metal layer capable of providing a work function value that is suitable for the device, such as equal to or greater than about 4.8 eV.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 120 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 120 may be fine-tuned to adjust the work function level. For example, a titanium nitride layer may be used as a p-type metal layer or an n-type metal layer, depending on the thickness and/or the compositions of the titanium nitride layer.

In some embodiments, the conductive filling layer 122 is made of a metal material. The metal material may include tungsten, aluminum, copper, another suitable material, or a combination thereof. The formation of the metal gate stack layers may involve multiple deposition processes. The deposition processes may include a CVD process, an ALD process, a PVD process, an electroplating process, an electroless plating process, a spin-on process, another applicable process, or a combination thereof.

Figure 1E:
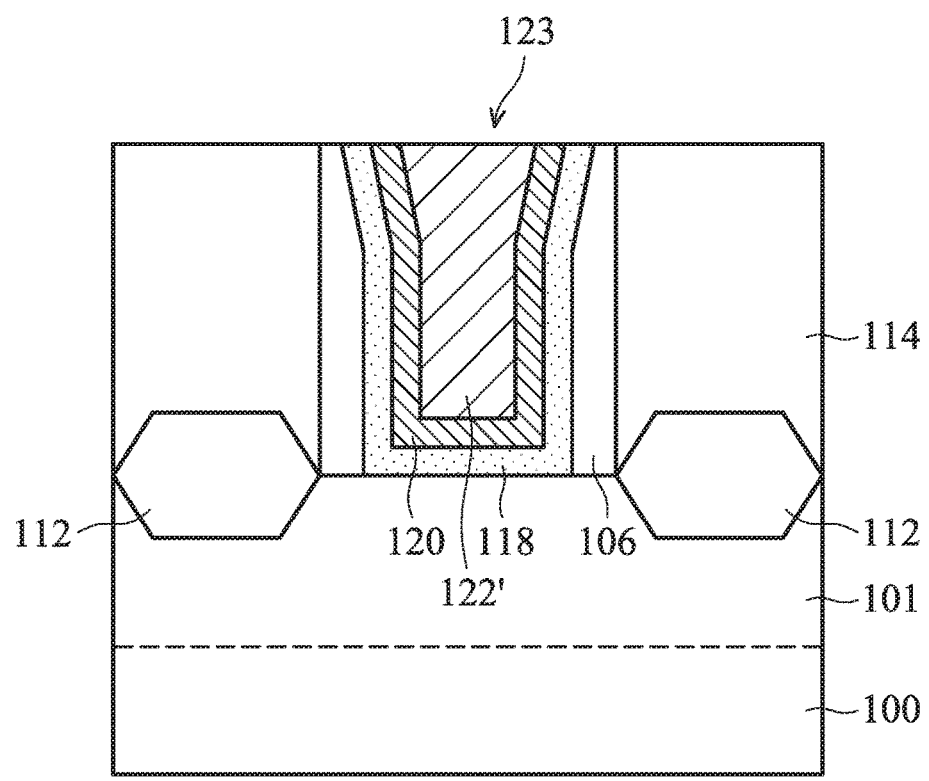

As shown in FIG. 1E, a planarization process is performed to remove the portions of the metal gate stack layers outside of the recess 116 between the spacer elements 106, in accordance with some embodiments. As a result, a metal gate stack 123 is formed. The metal gate stack 123 includes the gate dielectric layer 118, the work function layer 120, and a conductive electrode 122' that is a portion of the conductive filling layer 122.

Figure 1F:
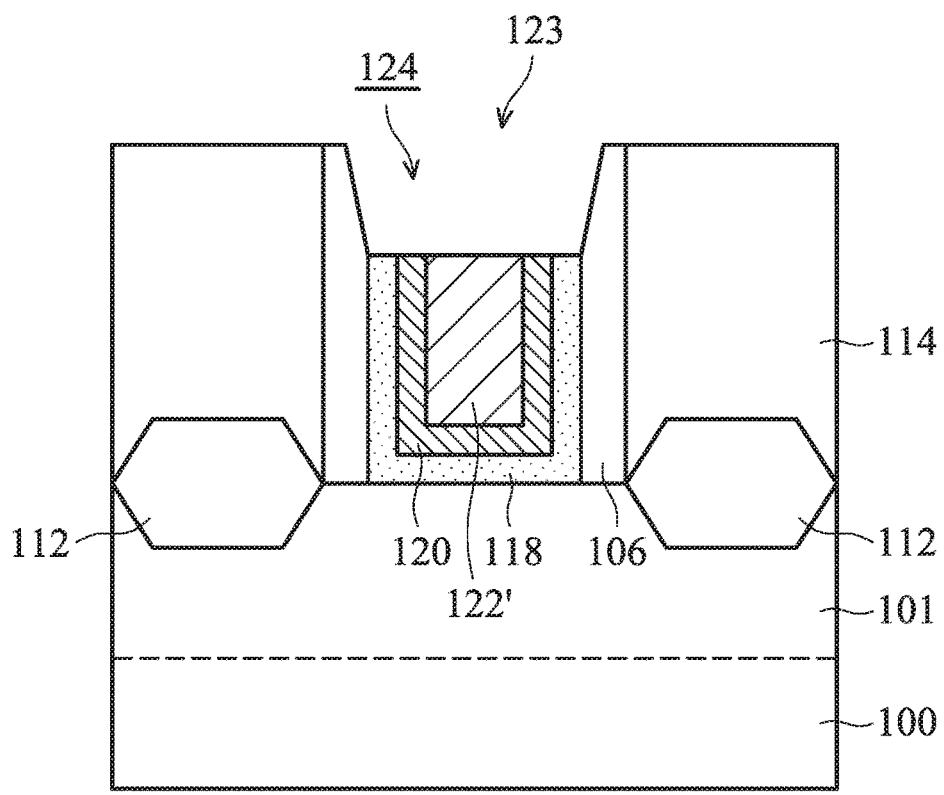

As shown in FIG. 1F, the metal gate stack 123 is partially removed to form a recess 124, in accordance with some embodiments. In some embodiments, the recess 124 is formed using an etching back process. In some embodiments, the metal gate stack 123 has a substantially planar top surface after the etching back process. In other words, top surfaces of the gate dielectric layer 118, the work function layer 120, and the conductive electrode 122' are substantially at the same height level. In some embodiments, because the metal gate stack 123 has a substantially planar top surface, the subsequent formation of a conductive contact on the metal gate stack is facilitated.

In some embodiments, a gas mixture is used as the reaction gas for performing the etching back process. The gas mixture may include $BCl_3$, HBr, $Cl_2$, $SF_6$, Ar, $N_2$, $O_2$, $SiCl_4$, $CF_4$, $CHF_3$, $CH_4$, $H_2$, another suitable gas, or a combination thereof. During the etching operations, the composition of the gas mixture may be varied according to requirements.

In some embodiments, the pressure during the etching operations is maintained in a range from about 1 mtorr to about 100 mtorrs. In some embodiments, the operation power used for performing the etching operations is in a range from about 100 W to about 1500 W. In some embodiments, the operation temperature for performing the etching operations is in a range from about 10 degrees C. to about 80 degrees C. In some embodiments, the operation time for performing the etching operations is in a range from about 5 seconds to about 600 seconds.

Figure 1G:
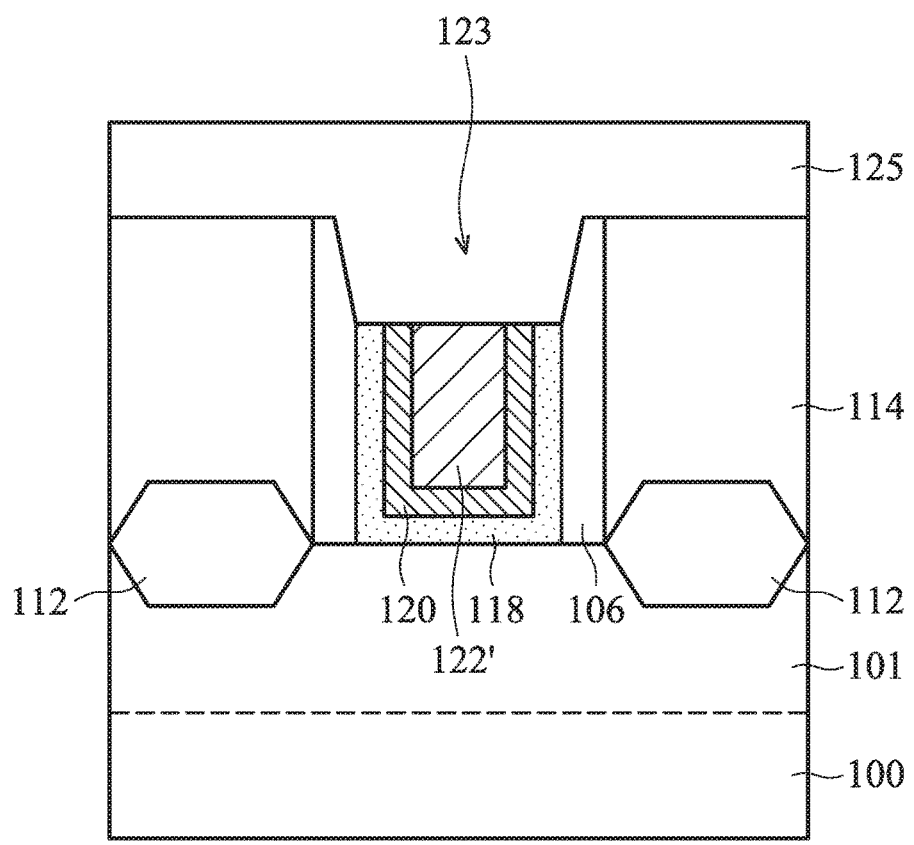

As shown in FIG. 1G, a protection material layer 125 is deposited over the dielectric layer 114 and the metal gate stack 123 to fill the recess 124. In some embodiments, the protection material layer 125 is made of a material that is different from that of the spacer elements 106. In some embodiments, the protection material layer 125 is made of a dielectric material. The dielectric material may include silicon nitride, silicon oxynitride, silicon carbide, silicon carbon nitride, oxide, another similar material, another suitable material, or a combination thereof. In some embodiments, the protection material layer 125 is deposited using a CVD process, an ALD process, a spin-on process, another applicable process, or a combination thereof.

Figure 1H:
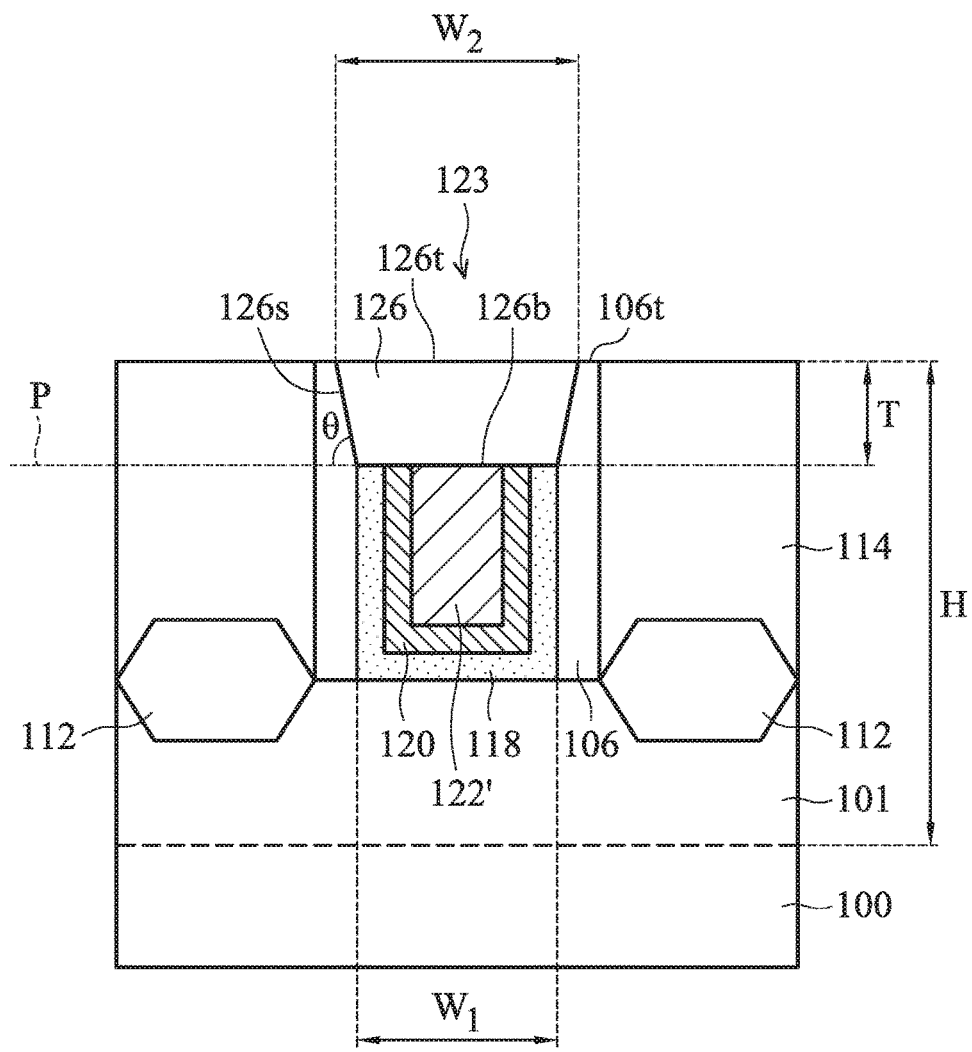

Afterwards, the portion of the protection material layer 125 outside of the recess 124 is removed, as shown in FIG. 1H in accordance with some embodiments. As a result, the remaining portion of the protection material layer 125 in the recess 124 forms a protection element 126, as shown in FIG. 1H. In some embodiments, a planarization process is used to partially remove the protection material layer 125 to achieve the formation of the protection element 126. In some embodiments, the planarization process includes a chemical mechanical polishing (CMP) process, a grinding process, an etching process, another applicable process, or a combination thereof.

As shown in FIG. 1H, the protection element 126 has a first width $W_1$ near a bottom 126b of the protection element 126 and a second width $W_2$ near a top 126t of the protection element 126. The width $W_2$ is greater than the width $W_1$. In some embodiments, the first width $W_1$ is in a range from about 20 nm to about 40 nm. In some embodiments, the second width $W_2$ is in a range from about 25 nm to about 50 nm. In some embodiments, the protection element 126 gradually becomes narrower along a direction from the top 126t towards the bottom 126b of the protection element 126 (the metal gate stack 123). In some embodiments, the spacer element 106 gradually becomes narrower along a direction from the bottom 126b of the protection element 126 towards the top 106t of the spacer element 106.

As shown in FIG. 1H, the protection element 126 has a thickness T. In some embodiments, the thickness T is in a range from about 100 Å to about 500 Å. In some embodiments, a total height H of the gate stack 123 over the fin structure 101 and the protection element 126 is in a range from about 300 Å to about 2000 Å. In some embodiments, a ratio (T/H) of the thickness T to the total height H s in a range from about 1/20 to about 3/5.

As shown in FIG. 1H, there is an angle θ between a side surface 126s of the protection element 126 and an imaginary plane P extending from the bottom 126b of the protection element 126. In some embodiments, the angle θ should be carefully controlled to be within a suitable range. In some embodiments, the angle θ is in a range from about 30 degrees to about 85 degrees. In some other embodiments, the angle θ is in a range from about 40 degrees to about 80 degrees.

Figure 1I:
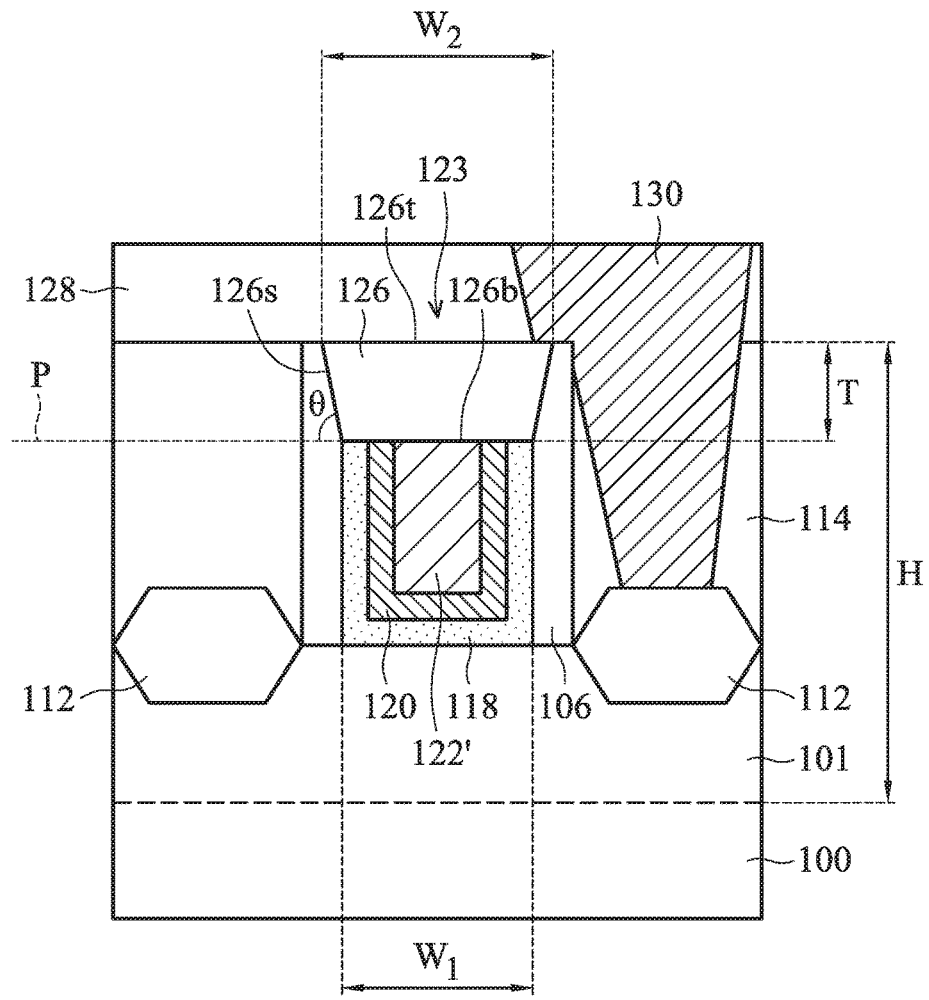

As shown in FIG. 1I, a conductive contact 130 is formed to electrically connect to a conductive feature over the semiconductor substrate 100, in accordance with some embodiments. In some embodiments, the conductive contact 130 is electrically connected to the source/drain feature 112 formed on the fin structure 101. In some embodiments, a dielectric layer 128 is formed over the structure shown in FIG. 1H before the formation of the conductive contact 130. Afterwards, the dielectric layer 128 is patterned to form a contact opening that exposes the conductive feature such as the source/drain feature 112.

In some embodiments, the dielectric layer 128 includes multiple dielectric layers. In some embodiments, the dielectric layer 128 includes a sub-layer that is used as an etch stop layer. In some embodiments, the dielectric layer 128 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, silicon nitride, another suitable material, or a combination thereof. In some embodiments, the dielectric layer 128 is deposited and planarized afterwards to form a substantially planar top surface. In some embodiments, the dielectric layer 128 is deposited using a CVD process, an ALD process, a spin-on process, another applicable process, or a combination thereof. In some embodiments, the dielectric layer 128 is planarized using a CMP process, a grinding process, an etching process, another applicable process, or a combination thereof.

Afterwards, a conductive material layer is deposited over the dielectric layer 128 to fill the contact opening, in accordance with some embodiments. A planarization process is used afterwards to remove the portion of the conductive material layer outside of the contact opening. As a result, the remaining portion of the conductive material layer in the contact opening forms the conductive contact 130, as shown in FIG. 1I.

In some embodiments, the conductive material layer is made of tungsten, aluminum, copper, gold, platinum, titanium, another suitable material, or a combination thereof. In some embodiments, the conductive material layer is deposited using a CVD process, a PVD process, an electroplating process, an electroless plating process, another applicable process, or a combination thereof.

Because the spacer elements 106 are partially removed to enlarge the recess 116, the protection element 126 that is formed later also has a wider upper portion. The protection element 126 with the wider upper portion may be used to protect the metal gate stack 123 during the formation of the conductive contact. As shown in FIG. 1I, even if a misalignment occurs during the formation of the contact opening, the protection element 126 protects the metal gate stack thereunder from damage. Due to the profile of the protection element, the top of the interface between the protection element 126 and the spacer element 106 is positioned laterally outside of the metal gate stack 123. Therefore, the etchant used during the formation of the contact opening is prevented from penetrating through the interface and reaching the metal gate stack 123. The metal gate stack 123 is therefore protected. A short circuiting is prevented between the metal gate stack 123 and the conductive contact 130. Therefore, the performance and reliability of the semiconductor device structure are significantly improved.

As mentioned above, in some embodiments, the angle θ between the side surface 126s and the imaginary plane P should be carefully controlled to be within a suitable range. In some embodiments, the angle θ is in a range from about 30 degrees to about 85 degrees. In some cases, if the angle θ is greater than about 85 degrees, the width $W_2$ may be too small, and the metal gate stack 123 is not protected appropriately. In some other cases, if the angle θ is smaller than about 30 degrees, the width $W_2$ may be too great, and occupy too much of the landing area for the conductive contact 130. The upper portion of the spacer element 106 may also be too thin for the sidewall of the metal gate stack 123 to be protected appropriately.

Figure 2:
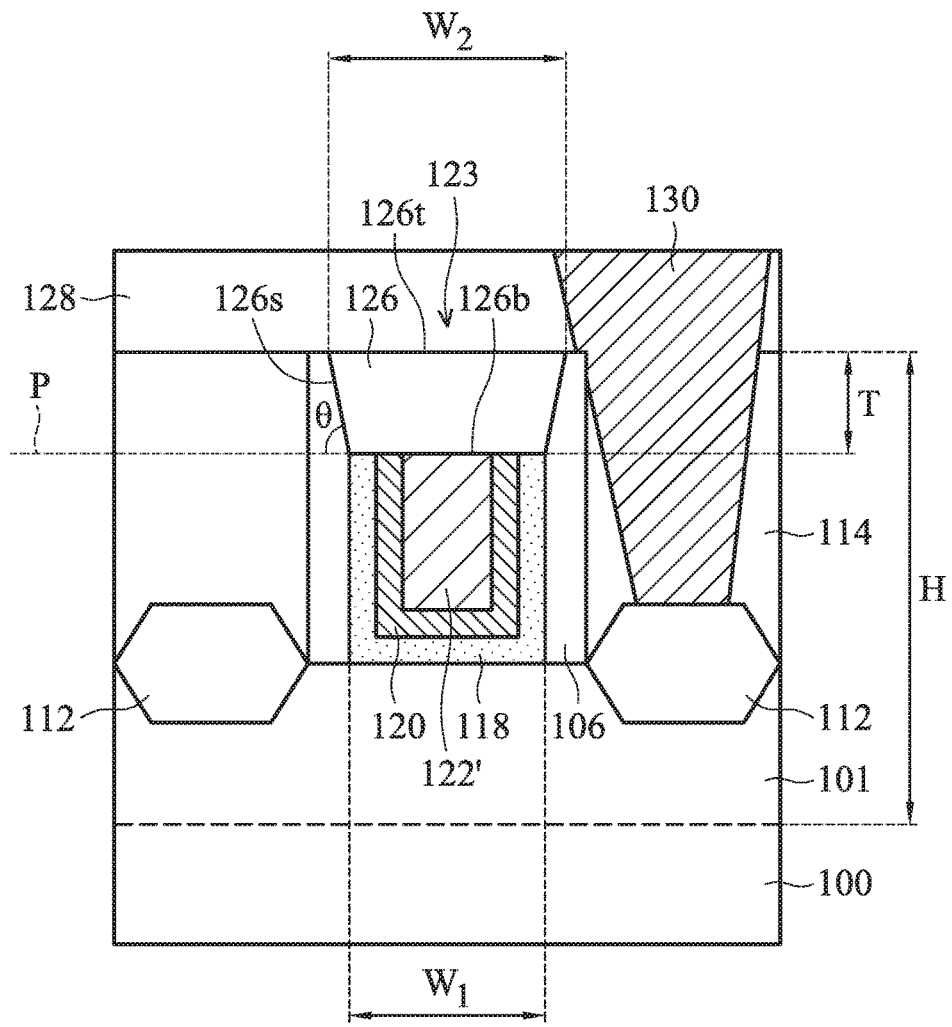
FIG. 2 is a cross-sectional view of a semiconductor device structure, in accordance with some embodiments.

In some embodiments, the conductive contact 130 is in direct contact with the spacer element 106, as shown in FIG. 1I. In some embodiments, the conductive contact is also in direct contact with the protection element 126. However, it should be appreciated that many variations and/or modifications can be made to embodiments of the disclosure. FIG. 2 is a cross-sectional view of a semiconductor device structure, in accordance with some embodiments. As shown in FIG. 2, the conductive contact 130 is in direct contact with the spacer element 106. However, in some embodiments, the conductive contact 130 is not in direct contact with the protection element 126.

As mentioned above, the metal gate stack 123 has a substantially planar top surface. However, it should be appreciated that embodiments of the disclosure are not limited thereto. Many variations and/or modifications can be made to embodiments of the disclosure. FIGS. 3A-3D are cross-sectional views of different semiconductor device structures, in accordance with some embodiments.

Figure 3A:
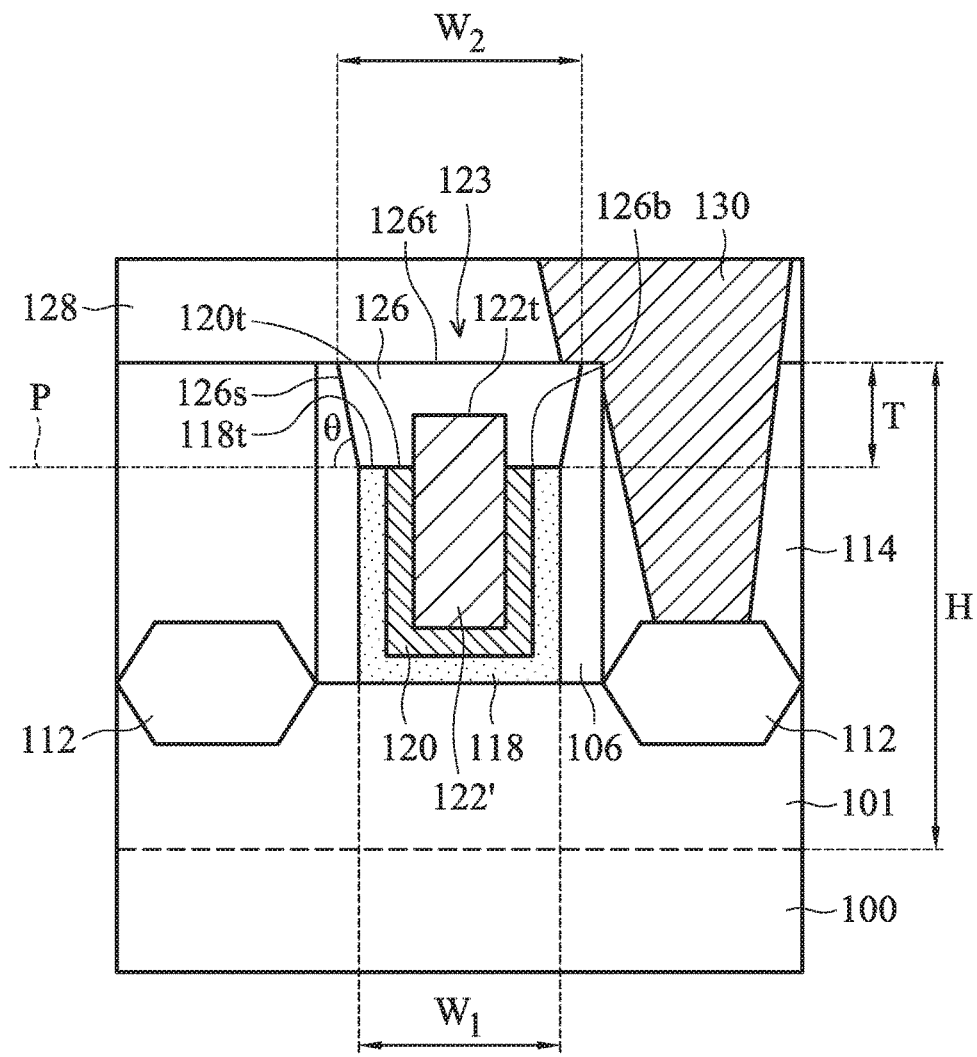
FIG. 3A is a cross-sectional view of semiconductor device structure, in accordance with some embodiments.

As shown in FIG. 3A, the conductive electrode 122' protrudes from the work function layer 120 and the gate dielectric layer 118, in accordance with some embodiments. By fine-tuning the etching back process, the top surface 122t of the conductive electrode 122' is at a higher height level than those of the work function layer 120 and the gate dielectric layer 118, in accordance with some embodiments. For example, an etching process that etches the work function layer 120 at a higher speed than the conductive electrode 122' is used.

Therefore, after the protection element 126 is formed, the top surface 122t of the conductive electrode 122' is between the top 126t and the bottom 126b of the protection element 126, as shown in FIG. 3A in accordance with some embodiments. In some embodiments, the top surface 120t of the work function layer 120 and the top surface 118t of the gate dielectric layer 118 are substantially at the same height level.

Afterwards, a conductive contact is formed to electrically connect to the conductive electrode 122' that protrudes from the work function layer 120 and the gate dielectric layer 118. In some embodiments, the conductive electrode 122' has a larger contact area with the subsequently formed conductive contact than the structure shown in FIG. 1I.

Figure 3B:
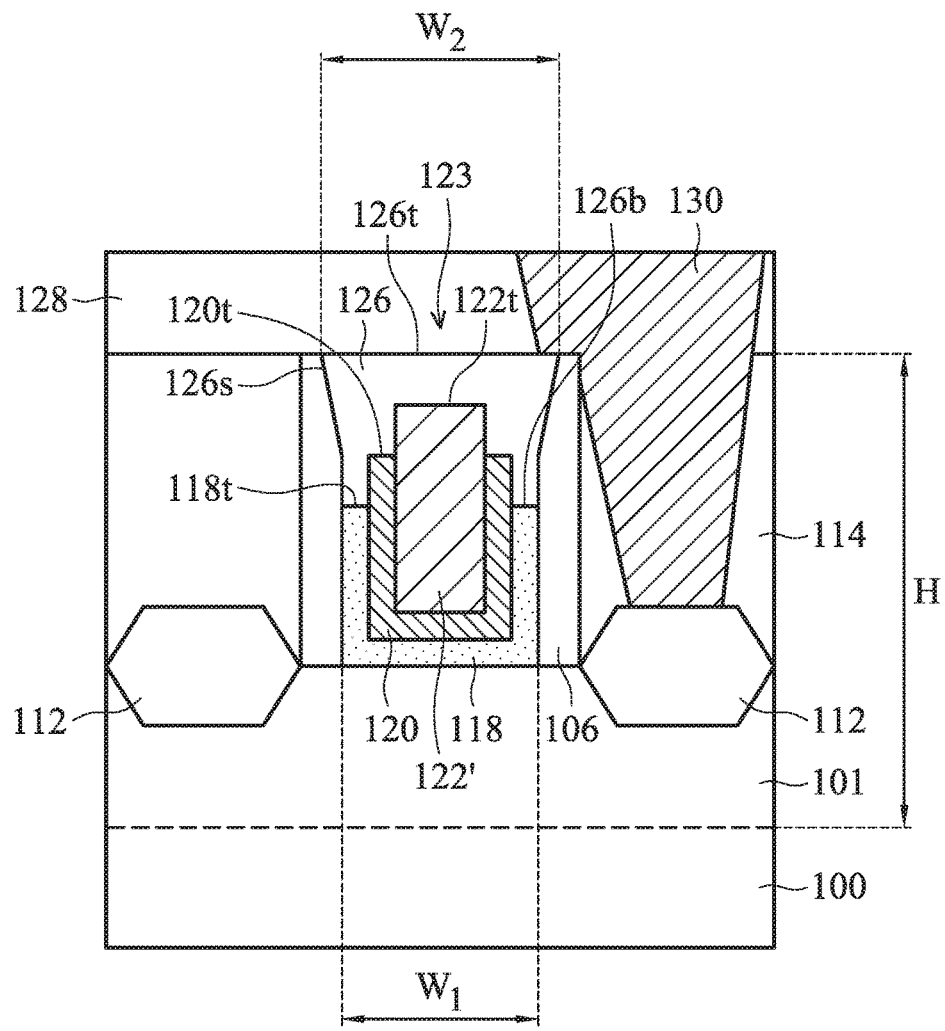
FIG. 3B is a cross-sectional view of semiconductor device structure, in accordance with some embodiments.

Many variations and/or modifications can be made to embodiments of the disclosure. As shown in FIG. 3B, by fine-tuning the etching back process, the top surface 120t of the work function layer 120 is at a higher height level than that of the gate dielectric layer 118, in accordance with some embodiments. In some embodiments, the top surface 120t of the work function layer 120 is between the top surface 122t of the conductive electrode 122' and the top surface 118t of the gate dielectric layer 118.

Figure 3C:
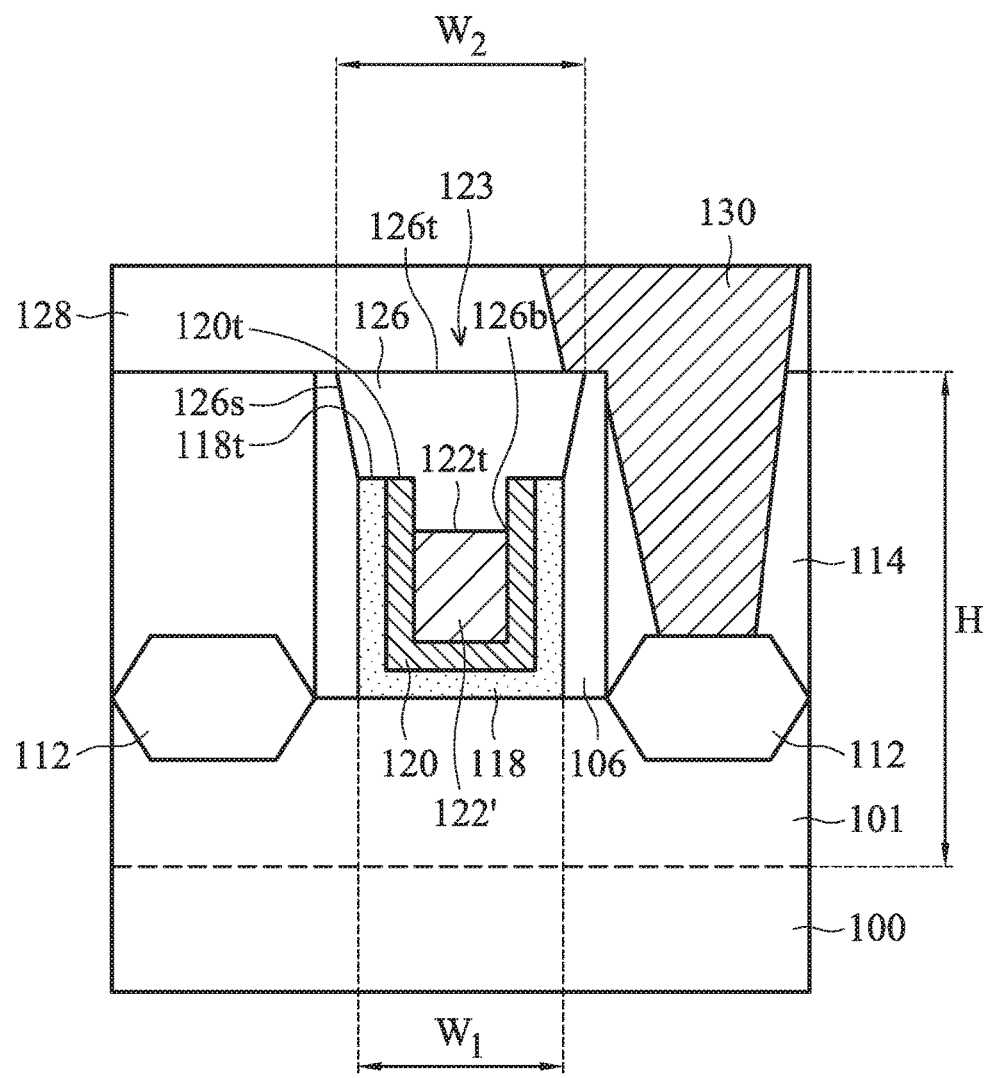
FIG. 3C is a cross-sectional view of semiconductor device structure, in accordance with some embodiments.

Many variations and/or modifications can be made to embodiments of the disclosure. As shown in FIG. 3C, the top surface 122t of conductive electrode 122' is below the top surface 120t of the work function layer 120 and the top surface 118t of the gate dielectric layer 118, in accordance with some embodiments. By fine-tuning the etching back process, the top surface 122t of the conductive electrode 122' is at a lower height level than those of the work function layer 120 and the gate dielectric layer 118. For example, an etching process that etches the conductive electrode 122' at a higher speed than the work function layer 120 is used. In some embodiments, the top surface 120t of the work function layer 120 and the top surface 118t of the gate dielectric layer 118 are substantially at the same height level.

Figure 3D:
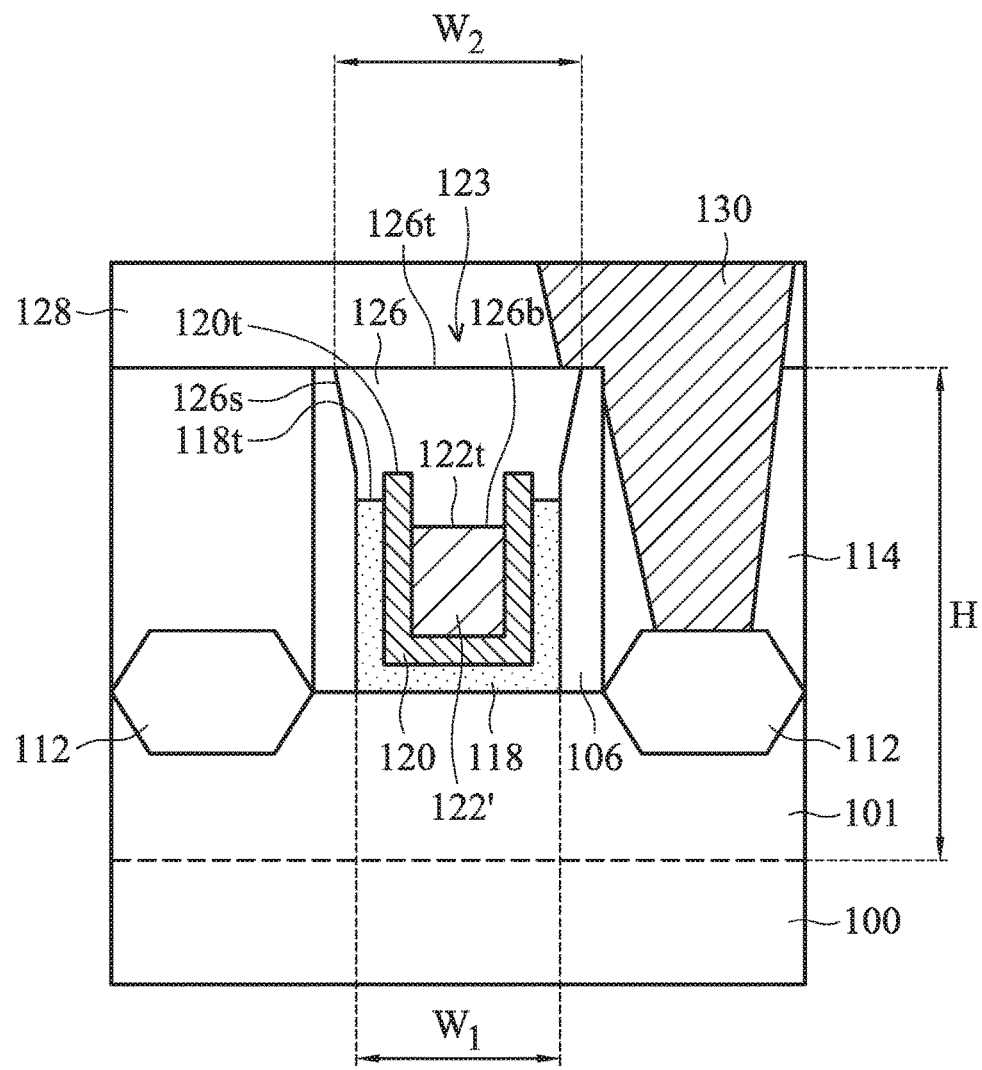
FIG. 3D is a cross-sectional view of semiconductor device structure, in accordance with some embodiments.

Many variations and/or modifications can be made to embodiments of the disclosure. As shown in FIG. 3D, by fine-tuning the etching back process, the top surface 120t of the work function layer 120 is at a higher height level than that of the gate dielectric layer 118. The top surface 120t is at a higher height level than the top surface 122t of the conductive electrode 122'.

Embodiments of the disclosure form a semiconductor device structure with a protection element over a gate stack. The protection element has a wider upper portion than a lower portion of the protection element. The protection element is used to protect the gate stack from being damaged during a subsequent contact formation. The reliability and performance of the semiconductor device structure are greatly improved.

In accordance with some embodiments, a semiconductor device structure is provided. The semiconductor device structure includes a gate stack over a semiconductor substrate and a protection element over the gate stack. The protection element has an upper portion and a lower portion between the upper portion and the gate stack, and the upper portion is wider than the lower portion. The semiconductor device structure also includes a spacer element over a side surface of the protection element and a sidewall of the gate stack. The semiconductor device structure further includes a conductive contact electrically connected to a conductive feature over the semiconductor substrate.

In accordance with some embodiments, a semiconductor device structure is provided. The semiconductor device structure includes a fin structure over a semiconductor substrate and a gate stack over the fin structure. The semiconductor device structure also includes a protection element over the gate stack. The protection element has an upper portion and a lower portion between the upper portion and the gate stack. The upper portion is wider than the lower portion. The semiconductor device structure further includes a spacer element over a side surface of the protection element and a sidewall of the gate stack. In addition, the semiconductor device structure includes a conductive contact electrically connected to a source/drain feature over the fin structure.

In accordance with some embodiments, a method for forming a semiconductor device structure is provided. The method includes forming a dummy gate stack over a semiconductor substrate and forming spacer elements over sidewalls of the dummy gate stack. The method also includes removing the dummy gate stack to form a recess between the spacer elements. The method further includes partially removing the spacer elements such that an upper portion of the recess becomes wider. In addition, the method includes forming a metal gate stack in the recess and forming a protection element over the metal gate stack to fill the recess.

In accordance with some embodiments, a semiconductor device structure is provided. The semiconductor device structure includes a gate stack over a semiconductor substrate and a protection element over the gate stack. A top of the protection element is wider than a bottom of the protection element. The semiconductor device structure also includes a spacer element over a side surface of the protection element and a sidewall of the gate stack. The semiconductor device structure further includes a conductive contact electrically connected to a conductive feature over the semiconductor substrate.

In accordance with some embodiments, a semiconductor device structure is provided. The semiconductor device structure includes a fin structure over a semiconductor substrate and a gate stack over the fin structure. The semiconductor device structure also includes a protection element over the gate stack, and a top of the protection element is wider than a bottom of the protection element. The semiconductor device structure further includes a spacer element over a side surface of the protection element and a sidewall of the gate stack. In addition, the semiconductor device structure includes a conductive contact electrically connected to a source/drain feature over the fin structure.

In accordance with some embodiments, a method for forming a semiconductor device structure is provided. The method includes forming a dummy gate stack over a semiconductor substrate and forming spacer elements over sidewalls of the dummy gate stack. The method also includes removing the dummy gate stack to form a recess between the spacer elements, and partially removing the spacer elements such that an upper portion of the recess becomes wider. The method further includes forming a metal gate stack in the recess and forming a protection element in the recess to cover the metal gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate stack over a semiconductor substrate, wherein the gate stack has a work function layer and a metal filling, and tops of the work function layer and the metal filling are at different height levels;
   a protection element over the gate stack, wherein a top and a bottom of the protection element have different widths;
   a spacer over a side surface of the protection element and a sidewall of the gate stack;
   a conductive feature over the semiconductor substrate; and
   a conductive contact electrically connected to the conductive feature.

2. The semiconductor device as claimed in claim 1, wherein the conductive contact is in direct contact with the protection element.

3. The semiconductor device as claimed in claim 1, wherein the conductive contact is separated from the protection element.

4. The semiconductor device as claimed in claim 1, wherein the gate stack has a top side and a bottom side, and the top side and the bottom side of the gate stack have different widths.

5. The semiconductor device as claimed in claim 1, wherein the spacer has an inner sidewall and an outer sidewall, the inner sidewall is between the outer sidewall and the gate stack, and an upper portion of the inner sidewall inclines towards the outer sidewall.

6. The semiconductor device as claimed in claim 1, wherein the conductive feature is a source/drain feature.

7. The semiconductor device as claimed in claim 1, wherein the protection element and the spacer are made of different materials.

8. The semiconductor device as claimed in claim 1, wherein the conductive contact extends across an interface between the spacer and the protection element.

9. The semiconductor device as claimed in claim 1, further comprising:
   a first dielectric layer surrounding a lower portion of the conductive contact; and
   a second dielectric layer surrounding an upper portion of the conductive contact.

10. A semiconductor device, comprising:
    a gate stack over a fin structure;
    a protection element over the gate stack, wherein a portion of the gate stack extends into the protection element;
    a spacer over a side surface of the protection element and a sidewall of the gate stack; and
    a conductive contact electrically connected to a source/drain feature over the fin structure.

11. The semiconductor device as claimed in claim 10, wherein the spacer and the protection element are made of different materials.

12. The semiconductor device as claimed in claim 10, further comprising:
    a first dielectric layer surrounding a lower portion of the conductive contact; and
    a second dielectric layer surrounding an upper portion of the conductive contact.

13. The semiconductor device as claimed in claim 12, wherein the upper portion of the conductive contact is wider than the lower portion of the conductive contact.

14. The semiconductor device as claimed in claim 10, wherein the conductive contact extends across an interface between the spacer and the protection element.

15. A semiconductor device, comprising:
    a gate stack over a semiconductor substrate;
    a protection element over the gate stack; and
    a first spacer and a second spacer located on opposite sides of the gate stack, wherein the first spacer has a first inclined surface, the second spacer has a second inclined surface facing the first inclined surface of the first spacer, and a portion of the gate stack is higher than a bottom of the first inclined surface.

16. The semiconductor device as claimed in claim 15, wherein a top and a bottom of the gate stack respectively have a first width and a second width, the first width and the second width are measured along directions parallel to each other, and the first width and the second width are different from each other.

17. The semiconductor device as claimed in claim 15, wherein the first spacer has an outer sidewall, and the first inclined surface is between the outer sidewall of the first spacer and the second inclined surface of the second spacer.

18. The semiconductor device as claimed in claim 15, wherein the gate stack comprises a work function layer and a metal filling, and tops of the work function layer and the metal filling are at different height levels.

19. The semiconductor device as claimed in claim 15, wherein the gate stack comprises a work function layer and a metal filling, and tops of the work function layer and the metal filling are substantially coplanar.

20. The semiconductor device as claimed in claim 15, wherein the gate stack comprises a conductive electrode, and a top surface of the conductive electrode is higher than the bottom of the first inclined surface.

\* \* \* \* \*